United States Patent
Weimer et al.

(10) Patent No.: US 6,239,430 B1
(45) Date of Patent: May 29, 2001

(54) PARTICLE BEAM APPARATUS WITH ENERGY FILTER

(75) Inventors: Eugen Weimer, Essingen; Johannes Bihr, Aalen, both of (DE)

(73) Assignee: Leo Elektronenmikroskopie GmbH (DE)

( * ) Notice: Subject to any disclaimer, the term of this patent is extended or adjusted under 35 U.S.C. 154(b) by 0 days.

(21) Appl. No.: 09/177,900

(22) Filed: Oct. 23, 1998

(30) Foreign Application Priority Data

Oct. 23, 1997 (DE) ............................................. 197 46 785

(51) Int. Cl.[7] ................. G21K 3/00; G21K 1/08
(52) U.S. Cl. .................. 250/305; 250/311; 250/396 ML
(58) Field of Search ............................ 250/305, 396 ML, 250/311

(56) References Cited

U.S. PATENT DOCUMENTS

| | | | |
|---|---|---|---|
| 3,745,337 | * 7/1973 | Koike | 250/305 |
| 4,740,704 | 4/1988 | Rose et al. | 250/396 ML |
| 4,760,261 | 7/1988 | Rose et al. | 250/396 ML |
| 4,812,652 | * 3/1989 | Egle et al. | 250/305 |
| 5,319,207 | 6/1994 | Rose et al. | 250/396 R |
| 5,449,914 | 9/1995 | Rose et al. | 250/396 ML |
| 5,502,306 | 3/1996 | Meisburger et al. | |
| 5,585,630 | * 12/1996 | Taniguchi et al. | 250/311 |
| 5,952,656 | * 9/1999 | Kaneyama | 250/305 |
| 5,955,732 | * 9/1999 | Tsumo | 250/305 |
| 6,040,576 | * 3/2000 | Benner | 250/311 |
| 6,066,852 | * 5/2000 | Taya et al. | 250/396 ML |

FOREIGN PATENT DOCUMENTS

| | | | |
|---|---|---|---|
| 0 218 920 A2 | 10/1986 | (EP) | H01J/49/44 |
| 62-93848 | 4/1987 | (JP) | H01J/37/28 |

OTHER PUBLICATIONS

European Search Report, EP 98 11 7973, 2 pgs.; 13/11/00.
IMB Technical Disclosure Bulletin, vol. 32, No. 8A, Jan. 1990, Title: Collector for Secondary Electrons Emitted in an SEM of Reduced Landing Energy.
Optik; H., Rose; Electrostatic Energy Filter as Monochromator of a Highly Coherent Electron Source; 2 pgs.; 86(1990) Dec., No. 3, Stuttgart, DE.
"Electrostatic energy filter as monochromator of a highly coherent electron source." H. Rose. Optik, 85 No. 3 (1990). pp. 95–98.

* cited by examiner

Primary Examiner—Teresa M. Arroyo
Assistant Examiner—Nikita Wells

(57) ABSTRACT

A particle beam apparatus that can be used, in particular in an electron microscope, has a dispersively imaging energy filter in the illumination beam path. A higher energy sharpness of the particles contributing to the further particle-optic imaging, and hence a reduction of the effect of chromatic aberrations, is attained by means of the energy filter. So that voltage fluctuations of the applied high voltage also bring about no drift of the image of the beam producer in spite of the dispersion present after complete passage through the filter, the beam producer is imaged, enlarged, in a plane of the filter that is imaged achromatically by the filter into an output image plane. Because of the high dispersion of the dispersive filter as against non-dispersive filters, the particle beam apparatus can be operated at a higher particle energy within the filter, so that the influence of the Boersch effect is reduced in comparison with non-dispersive filters.

15 Claims, 2 Drawing Sheets

PARTICLE BEAM APPARATUS WITH ENERGY FILTER

BACKGROUND OF THE INVENTION

1. Field of the Invention

This invention relates to a particle beam apparatus, and more particularly to a particle beam apparatus with an energy filter.

2. Discussion of Relevant Art

Particle beam apparatuses in the form of transmission electron microscopes with energy filters are known, for example, from U.S. Pat. Nos. 4,740,704, 4,760,261 and 5,449,914. The energy filters described in these documents are dispersive, that is, a charged particle entering the filter undergoes, on passing through the filter, a deflection which depends on the particle energy. The filter described in U.S. Pat. No. 4,740,704 is used by the inventors employer' in the transmission electron microscope 912 Omega manufactured and sold by LEO Elektronenmikroskopie GmbH. In the 912 Omega, the filter is arranged in the imaging beam path between the specimen to be investigated and the projection screen or the camera on which the specimen is electron-optically imaged. With such an energy filter on the imaging side, the energy loss which the particles have undergone in the specimen can be analyzed. At the same time, the imaging errors which depend on the energy, the chromatic aberrations, are reduced in the imaging beam path, since only particles with a reduced energy bandwidth contribute to the imaging.

For the correction of chromatic imaging errors, both in scanning electron microscopes and also in transmission electron microscopes, it is known from U.S. Pat. No. 5,319,207 to provide a mirror corrector in the illumination beam path between the electron source and the specimen to be investigated. The mirror corrector consists of a magnetic beam deflector and an electrostatic mirror which images into each other the two planes of symmetry within the magnetic beam deflector. Although the beam deflector has dispersive properties, the corrector is non-dispersive overall, that is, particles entering the corrector undergo, after passing completely through the corrector, no deflection which is dependent on the particle energy.

Such correctors are however relatively expensive and up to now have not been commercially offered.

As an alternative to a corrector, it is known from an article by H. Rose in Optik (Optics), Vol. 85 (No. 3), pp. 95–98 (1990), to provide an energy filter in the illuminating beam path of a transmission electron microscope. The energy filtering which is effected permits at least the energy-dependent errors to be reduced, because of the small energy bandwidth of the particles that contribute to subsequent imaging. Although here also the filter has dispersive elements for the splitting of the particle beam according to energy, the filter is overall free from dispersion, so that the particles entering the filter again undergo, after completely passing through the filter, no deflection which depends on energy. The freedom from dispersion of the whole filter is attained in that the filter is symmetrical about a midplane, and the dispersion in both of the mutually symmetrical filter portions is exactly opposed. This freedom of the filter from dispersion insures that small voltage fluctuations at the filter do not lead to a drift of the beam behind the filter. Dispersion-free filters however have the disadvantage that the dispersion that can be attained in the energy selection plane, in which the energy selection takes place by means of a slit diaphragm, is relatively small. And since the dispersion is in general dependent on the particle energy and decreases with increasing particle energy, the particle energy within the filter has to be relatively low when high energy sharpness is to be attained. In the article, the starting point was a particle energy of 3 keV, and in later work by H. Rose a significant energy region of 3–5 keV was specified. At low particle energies within the filter, however, a broadening of the energy bandwidth results because of the so-called Boersch effect. Since the Boersch effect has significant effects particularly in intermediate images of the particle source within the filter, because of the higher particle density in such intermediate images, the use was already proposed by H. Rose of a filter with exclusively astigmatic intermediate images within the filter.

Furthermore, a raster electron microscope with a dispersive energy filter between the source and the objective is known from Japanese Patent JP 62-93848. In the system described there, the filter is however only used for the production of a relative signal, so that the negative influence of the noise of the electron source on the subsequently produced picture can be eliminated by quotient formation between the actual secondary electron measurement signal and the relative signal.

SUMMARY OF THE INVENTION

The present invention has as its object to provide a particle beam apparatus in which the particle beam that is used for further imaging or picture production can have a high energy sharpness, and in which the influence of the Boersch effect is small.

This object is attained by a particle beam apparatus having a particle beam producer, an objective, and an energy filter that has dispersion and is arranged between the particle beam producer and the objective. The energy filter images a first input plane achromatically into a first output plane and a second input plane dispersively into a second output plane. The particle beam producer is imaged into the first input plane.

In the particle beam apparatus according to the invention, an energy filter is arranged on the illumination side, between the particle beam producer and an objective, as in the above-mentioned article. In contrast to the arrangement according to the above-mentioned article, this energy filter has a dispersion: that is, the particles that have passed through the whole filter have, at the end of the filter, a deflection which is dependent on their kinetic energy. A so-called imaging energy filter is concerned here, which images a first input plane achromatically into a first output plane, and simultaneously images a second input plane dispersively into a second output plane. The particle beam producer—or, more precisely, the surface of the particle beam producer that emits particles—is imaged in the first input plane of the energy filter, in the particle beam apparatus according to the invention, so that in spite of the dispersion of the energy filter, energy fluctuations of the particle beam do not lead to any drift of the image of the particle beam producer in and beyond the second output plane.

Since dispersive energy filters have a higher dispersion than dispersion-free energy filters, the average particle energy in the particle beam apparatus according to the invention can be chosen to be higher, at the same energy sharpness of the energy-filtered particle beam, than according to the state of the art. Because of this higher average particle energy, which can be between 5 and 35 keV, and should preferably amount to about 8–20 keV, the negative influence of the Boersch effect is markedly reduced.

The energy selection by a corresponding slit type selection diaphragm can take place, in the particle beam apparatus according to the invention, in the output side region of the energy filter or beyond the energy filter in the second output plane.

The imaging of the particle beam producer in the first input plane preferably takes place with enlargement, such that by means of the energy selection beyond the energy filter, no cutting down of the aperture of the particle beam takes place in the subsequent beam path.

In an advantageous embodiment example of the invention, the particles are already accelerated to a relatively high energy before they enter the energy filter, and pass through both the energy filter and the succeeding imaging stages with the same energy, and are braked to the smaller desired end energy only in the objective, or between the objective and the specimen to be investigated. This embodiment of the particle beam apparatus according to the invention can in particular be constructed as a low voltage scanning electron microscope, in which the particle beam is focused by the objective on the specimen to be investigated. To scan the specimen, a deflecting device is then provided in the region of the objective, and with it the particle beam focus can be deflected in two mutually orthogonal directions. The target energies in such low voltage scanning electron microscopes are between 10 eV and 10 keV.

A detector for the detection of secondary electrons emitted from the specimen to be investigated is provided between the objective and the filter in such a low voltage scanning electron microscope. A further detector can be provided for the detection of back-scattered particles from the specimen, the beam path of these back-scattered particles being preferably coupled sideways out of the energy filter. For the separation of the directly back-scattered particles from those particles which have undergone an energy loss, a further slit diaphragm can be arranged between the filter and the detector for the detection of the back-scattered particles.

As an alternative to the embodiment as a low voltage scanning electron microscope, the particle beam apparatus according to the invention can also be constructed as a high energy transmission electron microscope. In this case, the particle beam would be accelerated to the desired high target energy directly after exiting the energy filter.

The dispersion of the energy filter should be in the region between 5–20 $\mu$m/eV, preferably between 10 and 15 $\mu$m/eV, at the average particle energy within the filter. If the dispersion of the filter is less than 5–10 $\mu$m/eV, no sufficient energy sharpness can be attained, or slit widths of the selection diaphragm are required which are too small. If the upper boundary value of 15–20 $\mu$m/eV is exceeded, the aperture of the particle beam behind the selection diaphragm then becomes too large, with the consequence that the subsequent electron optical imaging elements produce greater aperture errors, so that the gain in resolution possible by the reduction of the chromatic errors is further compensated or even over-compensated.

BRIEF DESCRIPTION OF THE DRAWINGS

Details of the invention are described in further detail hereinbelow with reference to preferred embodiments shown in the accompanying drawings, in which.

DETAILED DESCRIPTION OF THE PREFERRED EMBODIMENTS

Figure 1:
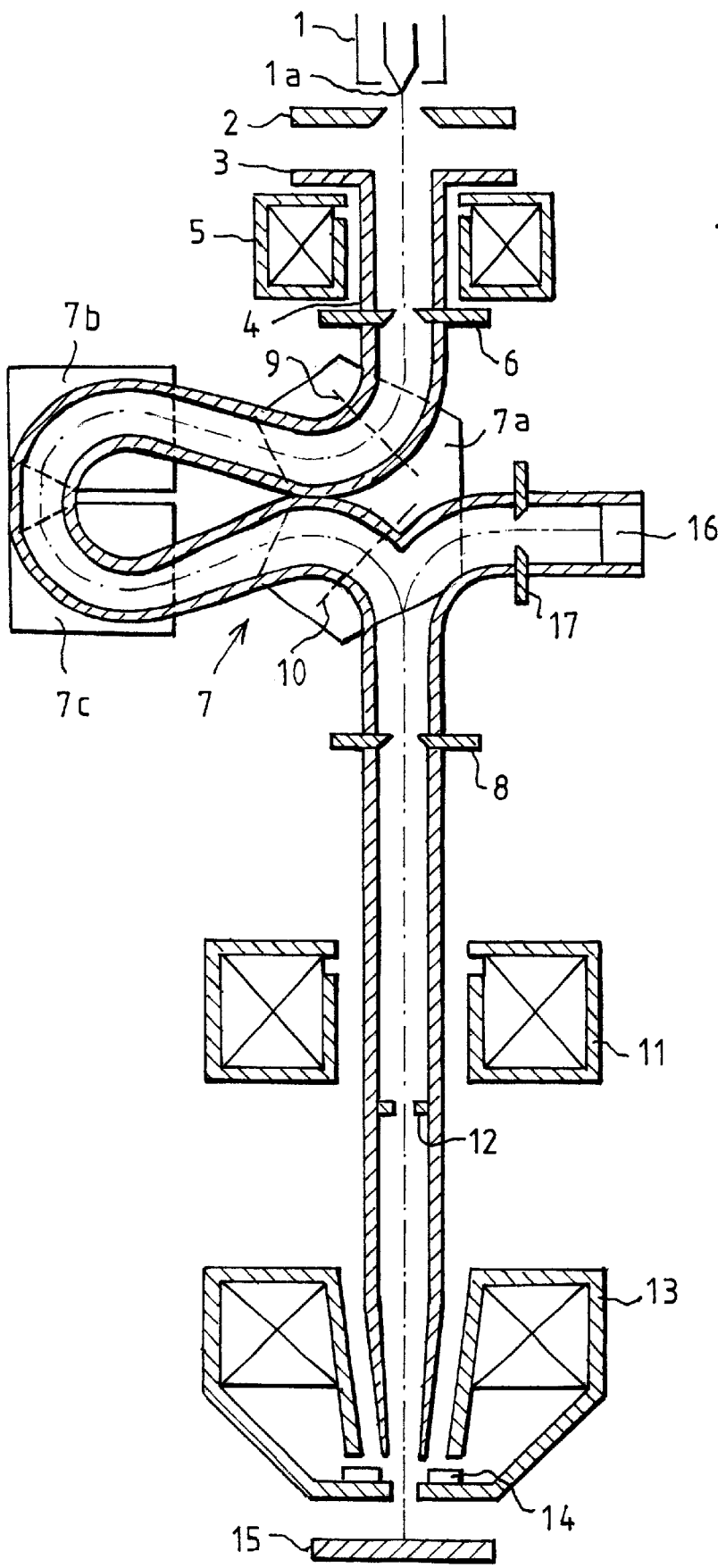
FIG. 1 shows a section through the electron optical components of a particle beam apparatus according to the invention in the form of a low voltage scanning electron microscope.

The beam producer in the form of a thermal field emission source is shown in FIG. 1, denoted overall as (1) and the cathode tip which emits electrons as (1a). Electrons are extracted from the cathode tip (1a) by means of an extraction electrode (2) which is at a positive potential, and are then accelerated to the potential of the anode (3). The anode is electrically connected to a beam guiding tube (4) which passes through the whole apparatus and is of electrically conductive material. The anode potential, and hence the potential of the beam guiding tube (4), is about 10 kV relative to ground. The anode is directly followed by a magnetic condenser lens (5), and the condenser lens (5) is followed by an aperture diaphragm (6). The energy filter (7) is an imaging dispersive electron energy filter which images a so-called input image plane (9) (first input plane) stigmatically and achromatically into an output image plane (10) (first output plane) and simultaneously images an input diffraction plane (second input plane) dispersively and stigmatically into an output diffraction plane (second output plane). The aperture diaphragm (6) is arranged in the input diffraction plane; that is, this plane coincides with the plane of the aperture diaphragm (6). The energy selection diaphragm (8) is arranged in the output diffraction plane, and is constituted as a slit diaphragm. The dispersive filter (7) itself is a purely magnetic filter; the three magnet sectors of the filter are denoted by (7a–7c). The detailed construction of the filter is described in U.S. Pat. No. 4,740,704, which should be consulted for constructional details of the filter.

In spite of the construction of the filter (7) which is symmetrical with respect to a plane perpendicular to the plane of the drawing in FIG. 1, the filter (7) has a dispersion, that is, the electrons passing through the filter have beyond the filter a deflection perpendicular to the optical axis and dependent on their energy, so that those electrons are trapped which have an energy deviation from the mean energy which is greater than the energy deviation defined by the dispersion and slit width. In order for high voltage fluctuations to bring about no lateral drift of the successive images of the cathode tip (1a) emitting the electrons, the cathode tip (1a) is imaged by the condenser lens (5) in the input image plane (9) of the filter (7), and in fact is imaged by the filter (7) achromatically in the output image plane (10).

A second condenser lens (11) follows the energy selection diaphragm (8), and images the selection diaphragm (8) in the rear focal plane of the objective lens (13). Simultaneously, the condenser lens (11), by imaging the output image plane (10) of the filter (7) produces a further intermediate image of the cathode tip (1a), which is imaged by the succeeding objective lens (13), once again greatly reduced, onto the specimen (15) to be investigated. The objective lens (13) is a combination of a magnetic and electrostatic lens. The specimen (15) and the pole shoes of the objective lens (13) are at ground potential, so that the electrons after leaving the beam guiding tube (4) are substantially braked to the target energy of between 10 eV and 5 keV between the end of the beam guiding tube (4) and the outer pole shoe of the objective lens (13). A further magnetic deflecting system (14) is arranged in the pole shoe gap of the objective lens (13), for scanning a large lateral region of the specimen (15).

For the detection of the secondary electrons leaving the specimen (15), a rotationally symmetrical electron detector (12) with a middle bore is arranged between the objective lens (13) and the second condenser lens (11). This detector can be constructed as a scintillation detector, semiconductor detector, or microchannel plate detector.

Figure 2:
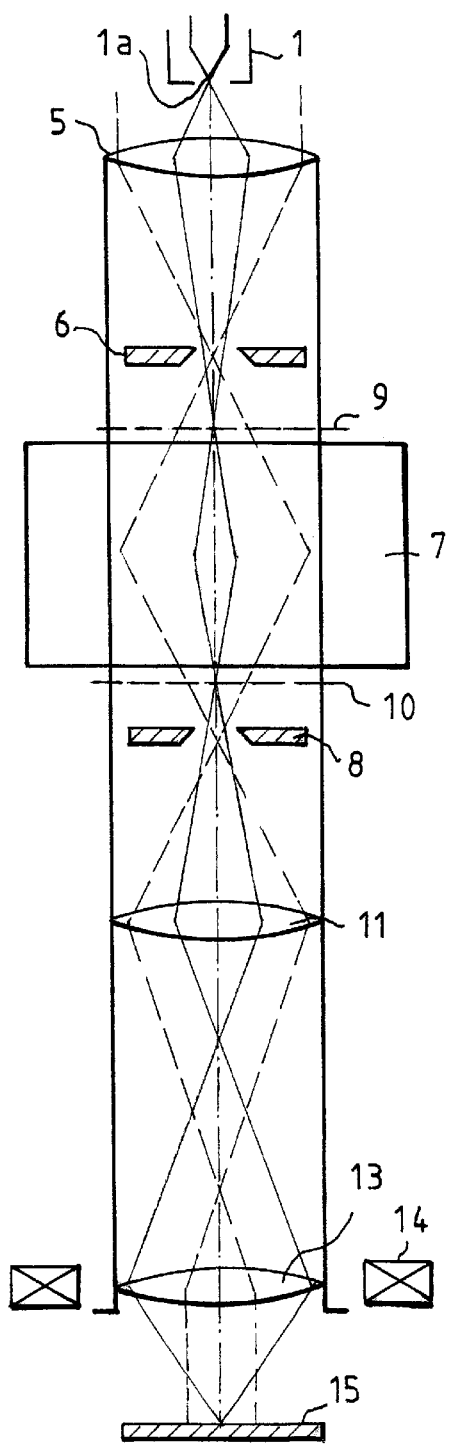
FIG. 2 shows the principal beam path in a low voltage scanning electron microscope according to FIG. 1.

The detailed electron optical beam path is shown in FIG. 2. The cathode tip (1a) which emits electrons is imaged by the first condenser lens (5) into the input image plane (9) of the dispersive filter (7), which is imaged achromatically and stigmatically by the filter into the output image plane (10). The aperture diaphragm (6) is arranged between the first condenser lens (5) and the input image plane (9) of the filter (7), in that plane which is imaged by the filter (7), stigmatically and dispersively, into the output side conjugate plane in which the selection diaphragm (8) is arranged. The imaging of the cathode tip (1a) into the input image plane (9) here takes place with an enlargement of 5–40, and there thus results a corresponding reduction of the effective aperture within the filter (7) and in the plane of the selection diaphragm (8). The energy filtering on the output side of the filter (7) thereby leads to no appreciable cutting down of the aperture of the electron beam bundle.

When the energy filter has a dispersion of 10–15 $\mu$m/eV at an electron energy of 10 keV, an energy width of 0.1–0.2 eV is set with a selection diaphragm (8) which has a slit width of 2 $\mu$m. Since the distance between the input image plane (9) and the input diffraction plane (6) amounts to 40–80 mm in typical dispersive energy filters, an aperture of $1.5 \times 10^{-5}$ is transmitted without problems, in spite of the small slit width. With the subsequent two-stage imaging system of the second condenser lens (11) and the objective lens (13), by means of which the probe tip (1a) image present in the output image plane (10) is imaged on the object (15) with a reduction of about 400–700 times, optimum end apertures in the region of $6 \times 10^{-3}$ through $1 \times 10^{-2}$, and probe sizes between about 1 nm and 3 nm, then result in the specimen plane.

The electrons which are back-scattered at the specimen (15) are accelerated back into the beam guiding tube (4) by the deceleration field between the specimen end of the beam guiding tube (4) and the specimen (15), and again have exactly the same energy as the primary electrons and therefore reach the filter system (7) backward. However, because of the opposite direction of motion, these back-scattered electrons are deflected in the opposite direction in the magnet sector (7a) of the filter, and on this path reach a primary electron detector (16). This primary electron detector (16) can be constructed in the usual manner as a scintillation detector, semiconductor detector, or microchannel plate detector. A second slit diaphragm (17) is furthermore arranged between the magnet sector (7a) and the primary electron detector (16), and filters out electrons which have other energies, and which have for example undergone an interaction with the specimen (15) or with the selection diaphragm (8).

In the embodiment example of the invention shown in FIGS. 1 and 2, the dispersive filter is constructed according to U.S. Pat. No. 4,740,704. A so-called Omega filter is concerned here, and is also used by the inventors employer in the transmission electron microscope 912 Omega. The filter (7) can also be alternatively constructed as a so-called "alpha filter" corresponding to U.S. Pat. No. 4,760,261 or corresponding to U.S. Pat. No. 5,449,914.

Figure 3:
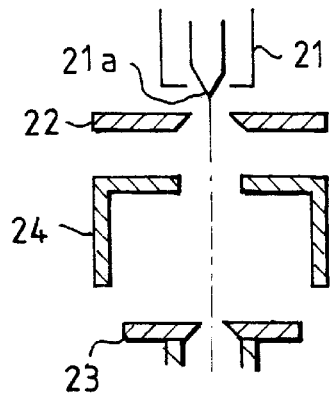
FIG. 3 shows a sketch of the principles of the source side portion of a particle beam apparatus according to the invention, with an electrostatic condenser.

In the embodiment example according to FIG. 1, the first condenser lens (5) is constructed as a magnetic lens. In the embodiment example shown in FIG. 3, the condenser lens (24) is an electrostatic lens which is integrated into the beam producer (21) with the cathode tip (21a). This asymmetrical electrostatic immersion lens (24) is arranged between the extraction electrode (21) and the anode (23). It has a considerably greater aperture diameter on the side facing the beam producer (21) than on the side facing the anode (23). The cathode tip (21a) which emits electrons is also directly imaged, magnified by such an electrostatic immersion lens (24), in the input image plane (not further illustrated) of the succeeding dispersive filter.

Figure 4A:
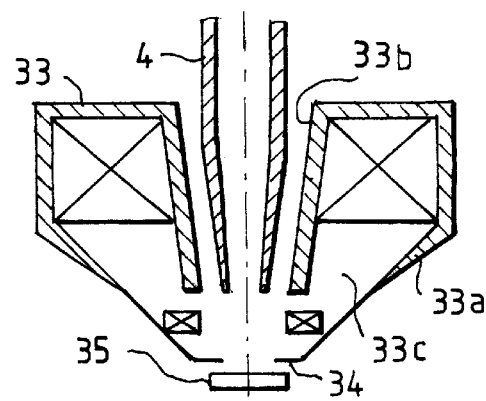
FIGS. 4a and 4b show two further alternative embodiments of the objective lens for a low voltage scanning electron microscope according to FIG. 1.
Figure 4B:
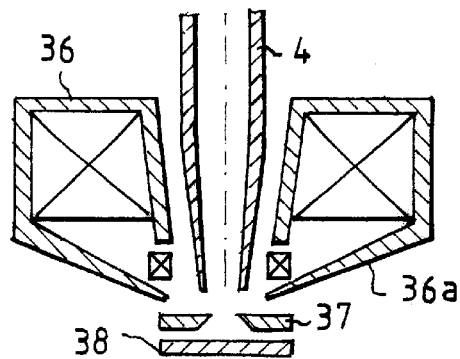

Two alternative objective lenses are shown in FIGS. 4a and 4b, and are preferably used in combination with the invention. The difference between the objective lens (33) in FIG. 4a and the objective lens (13) in FIG. 1 is that in the objective lens (33) the outer pole shoe (33a) is shortened, and ends at the same height as the inner pole shoe (33b). An annular pole shoe gap (33b) results which is aligned perpendicularly to the optical axis (shown dot-dashed). By this construction of the pole shoe gap, the magnet field exits in the direction toward the specimen (35), resulting in a stronger immersion of the specimen (35) and hence a reduction of the aperture aberrations. Electrodes (34) for the superposed electrostatic lens are then constructed as .extensions of the outer pole shoe (33a).

The objective lens (36) in FIG. 4b differs from the objective lenses described hereinabove in that the beam guiding tube (4) is extended and ends only at the height of the outer pole shoe (36a) of the magnetic lens (36) or even behind it. The electrostatic lens between the specimen side end of the beam guiding tube (4) and the braking electrode (37) arranged between the specimen,(38) and the objective then first arises beyond the magnetic lens (36). In this embodiment example, the specimen (38) and the braking electrode (37) are at a common potential, which is negative relative to ground. The use of this objective offers advantages particularly at the lowest target energies, since even at the lowest target energies the cathode can be kept at a relatively high potential relative to ground, thus making the negative influence of leakage fields less strongly noticeable.

We claim:

1. A particle beam apparatus producing a beam of charged particles, for illuminating a sample arranged in a sample plane, comprising:
   a particle beam producer,
   an objective, and
   an energy filter that has dispersion and is arranged between said particle beam producer and a sample plane; said energy filter imaging a first input plane achromatically into a first output plane and a second input plane dispersively into a second output plane, said particle beam producer being imaged into said first input plane.

2. The particle beam apparatus according to claim 1, further comprising a diaphragm in said second output plane, by which energy filtering takes place.

3. The particle beam apparatus according to claim 1, in which said particle beam producer is imaged, enlarged, in said first input plane.

4. The particle beam apparatus according to claim 1, in which said particle energy within said filter is between 5 and 30 keV.

5. The particle beam apparatus according to claim 1, in which particles are braked to a smaller end energy in said objective, or between said objective and a specimen to be investigated.

6. The particle beam apparatus according to claim 1, in which said particle beam producer is focused by said objective on a specimen to be investigated, further comprising a deflecting device for scanning said specimen to be investigated.

7. The particle beam apparatus according to claim 1, further comprising a detector arranged between said objective and said filter for detection of secondary particles.

8. The particle beam apparatus according to claim 7, further comprising a further detector for detection of backscattered particles.

9. The particle beam apparatus according to claim 8, in which said further detector comprises a diaphragm for energy selection arranged between said filter and said detector for the detection of secondary particles.

10. The particle mean apparatus according to claim 1, in which said filter has a dispersion for the energy of particles of between 5 and 20 $\mu$m/eV.

11. The particle beam apparatus according claim 10, in which said filter has a dispersion for the energy of particles of between 10 and 15 $\mu$m/eV.

12. A particle beam apparatus producing a beam of charged particles, for illuminating a sample arranged in a sample plane, comprising:

a particle beam producer, an objective, and an energy filter that has dispersion and is arranged between said particle beam producer and a sample plane, said energy filter imaging a first input plane achromatically into a second output plane, said particle beam producer being imaged into said first input plane, wherein said particle beam producer is focused by said objective on a specimen to be investigated, further comprising a deflecting device for scanning said specimen to be investigated.

13. A particle beam apparatus producing a beam of charged particles for illuminating a sample arranged in a sample plane, comprising:

a particle beam producer, an objective, an energy filter that has dispersion and is arranged between said particle beam producer and a sample plane, said energy filter imaging a first plane achromatically into a first output plane and a second input plane dispersively into a second output plane, said particle beam producer being imaged into said first input plane, and a detector arranged between said objective and said filter for detection of secondary particles.

14. The particle beam apparatus according to claim 13, further comprising a further detector for detection of backscattered particles.

15. The particle beam apparatus according to claim 14, in which said further detector comprises a diaphragm for energy selection arranged between said filter and said detector for detection of secondary particles.

* * * * *